United States Patent [19]

Branan et al.

[11] Patent Number: 5,132,877
[45] Date of Patent: Jul. 21, 1992

[54] MOLDED ELECTRICAL ASSEMBLY HAVING AN INTEGRAL CONNECTOR

[76] Inventors: Mac W. Branan, 1211 SE. 11th St., Fr. Lauderdale, Fla. 33316; David E. Reiff, 16911 SW. 66th St., Ft. Lauderdale, Fla. 33331; Dale W. Dorinski, 8740 NW. 17th Manor, Coral Springs, Fla. 33071

[21] Appl. No.: 548,392
[22] Filed: Jul. 5, 1990
[51] Int. Cl.$^5$ .......................... H05K 1/11; H01R 9/09
[52] U.S. Cl. ...................................... 361/395; 439/76; 439/676
[58] Field of Search ............... 439/55, 76, 78, 86, 439/676; 364/708; 361/380, 395, 400

[56] References Cited

U.S. PATENT DOCUMENTS

| | | | |
|---|---|---|---|
| 4,123,756 | 10/1978 | Nagata et al. | 343/702 |
| 4,181,964 | 1/1980 | Moore et al. | 364/708 |
| 4,380,794 | 4/1983 | Lawson | 362/296 |
| 4,627,736 | 12/1986 | Komaki | 364/708 |
| 4,758,459 | 7/1988 | Mehta | 174/255 |
| 4,894,663 | 1/1990 | Urbish et al. | 343/702 |
| 4,922,070 | 5/1990 | Dorinski | 200/512 |

FOREIGN PATENT DOCUMENTS 1957847  5/1971  Fed. Rep. of Germany ........ 439/55

Primary Examiner—Leo P. Picard
Assistant Examiner—Michael W. Phillips

[57] ABSTRACT

The electrical assembly of the present invention comprises an integrally molded member which includes at least one three dimensional connector. Electrical printed circuitry are disposed on the integrally molded member, wherein portions of the printed circuitry comprise electrical contacts of the connector. Electrical components are placed on the integrally molded member and are electrically interconnected via the printed circuitry.

6 Claims, 3 Drawing Sheets

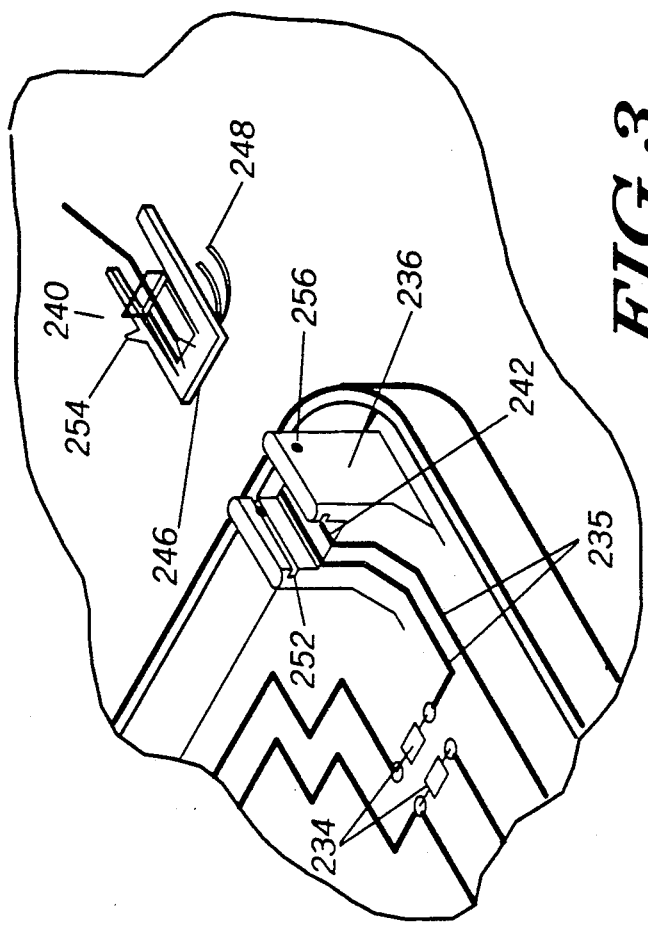
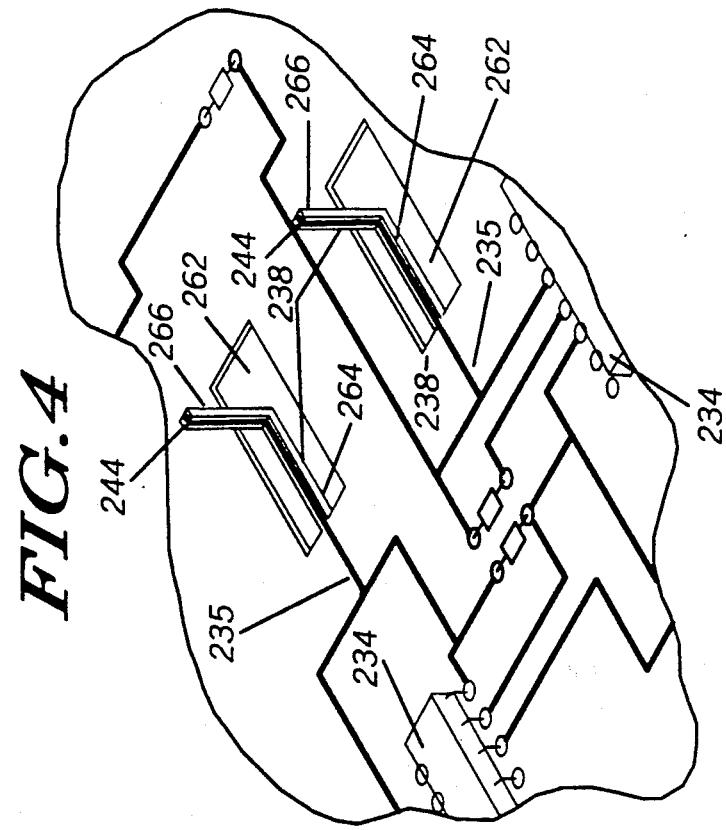

MOLDED ELECTRICAL ASSEMBLY HAVING AN INTEGRAL CONNECTOR

TECHNICAL FIELD

This invention relates generally to the field of electrical assemblies and in particular to those assemblies which utilize integrally molded circuit boards.

BACKGROUND

Many electronic devices, such as portable two-way radios, pagers, and their accessories, comprise electrical assemblies which may include a number of sub-assemblies, such as a housing sub-assembly, main bard sub-assembly, etc. Generally, the sub-assemblies comprise piece parts and electrical components, such as printed circuit boards, connectors, switches, and integrated circuits (IC).

In today's competitive world, quality and costs associated with manufacturing of a device are of utmost importance to the manufacturers. Generally, quality and manufacturing costs are improved by reducing the number of the sub-assemblies, and the components used in an electronic device. Reduction of piece parts and sub-assemblies reduces manufacturing complexity and cost as well as greatly enhancing the quality of the electronic device. Another advantage of reduced piece parts is the reduction of inventory costs which in turn further reduce the manufacturing costs associated with the electronic device.

Referring to FIG. 1, exploded view of an electronic device 100 which uses conventional electrical assemblies is shown. The electronic device 100 comprises a well known battery charger for a two-way portable radio manufactured by Motorola Inc. The electronic device 100 includes a housing sub-assembly 110, a main board 120, and a base plate 130. The electronic device 100 is assembled by positioning the main board 120 between the housing sub-assembly 110 and the base plate 130. Thereafter, the housing sub-assembly 110 and the base plate 130 are fastened to each other by a complementary snapping mechanism. The snapping mechanism is provided by the projections 132 and apertures (not shown) on the housing sub-assembly 110 and the base plate 130.

The main board 120 includes a printed circuit board (PCB) 121 having placed thereon electrical components 122, a receptacle connector 124, and a spring connectors 126. The main board 120 carries charging circuitry of the electronic device 100. The electrical components 122 and the connectors 124 and 126 are electrically interconnected via printed circuits 128. In this arrangement, the electrical components 122 are placed utilizing well known leadless component assembly techniques, whereas the connectors 124 and 126 are hand soldered to the PC board 122.

In the assembly of the electronic device 100, the connectors 124 and 126 comprise three dimensional piece parts which due to their shape and design requirements of the electronic device 100 may not be placed on the PC board 121 by automated placement techniques, such as leadless component assembly (LCA). Therefore, the more tedious, labor intensive, and unreliable hand soldering process is utilized which not only increases the manufacturing cost but also may not meet today's rigid quality standards.

SUMMARY OF THE INVENTION

Accordingly, it is an object of the present invention to reduce the number of piece parts and/or sub-assemblies required for manufacturing an electrical assembly by integrating three dimensional electrical connectors into the main board assembly.

Briefly, according to the invention, the electrical assembly comprises an integrally molded member which includes at least one three dimensional connector. Electrical printed circuitry are disposed on the integrally molded member, wherein portions of the printed circuitry comprise electrical contacts of the connector.

BRIEF DESCRIPTION OF THE DRAWINGS

FIG. 3, is a fragmentary view of the electrical assembly which includes one embodiment of the present invention.

FIG. 4, is a fragmentary view of the electrical assembly which includes another embodiment of the present invention.

DETAILED DESCRIPTION OF THE PREFERRED EMBODIMENT

Figure 2:
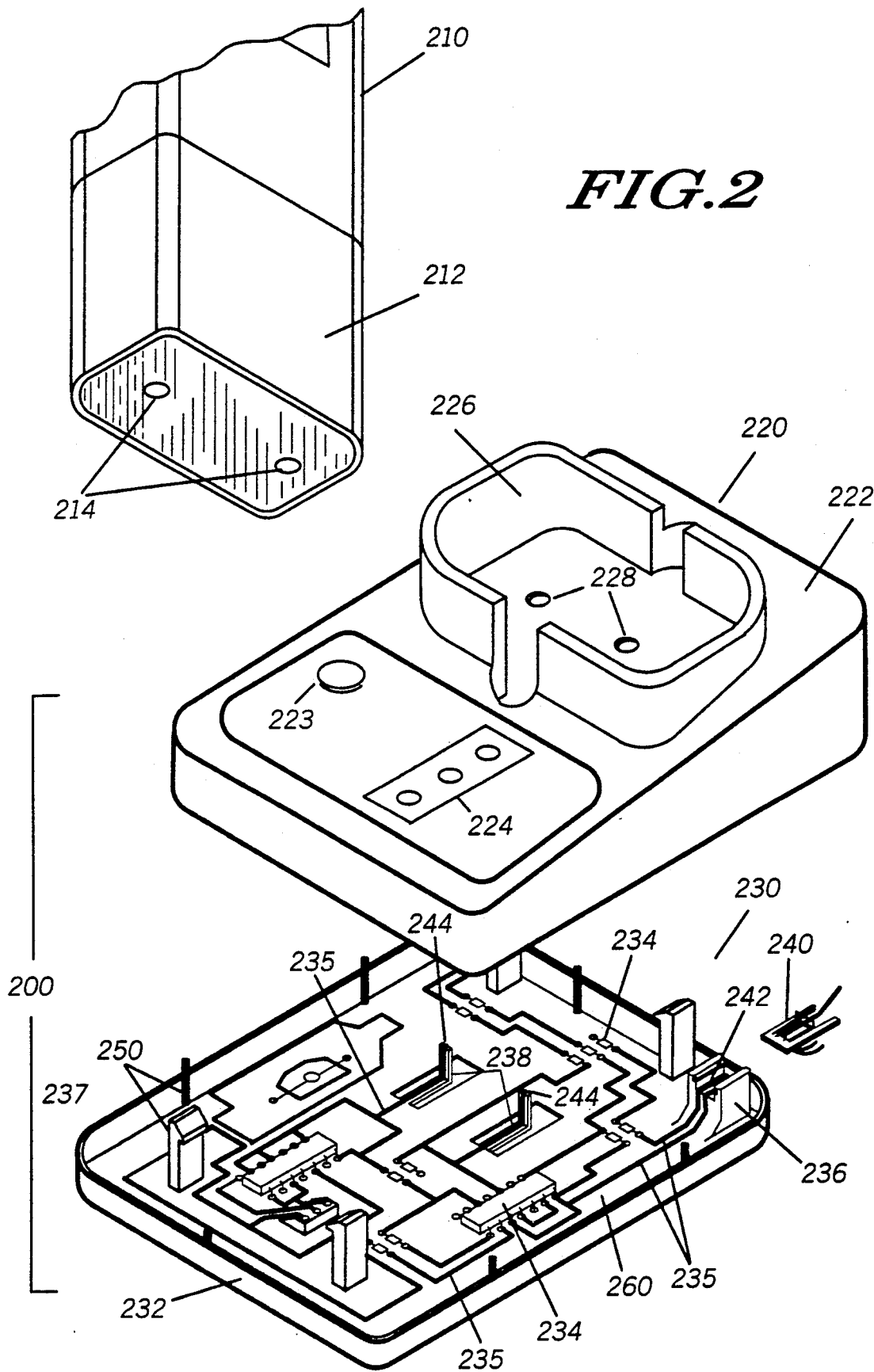
FIG. 2, is an exploded view of the electrical assembly according to the present invention.

Referring to FIG. 2, the exploded view of an electronic device 200 which utilizes the electrical assembly of the present invention is shown. The device 200 comprises a battery charger for a battery 212 used in a portable-two way radio 210. The radio 210 comprises one of the HT ™ family of portable two-way radios manufactured by Motorola Inc. The device 200 comprises a housing assembly 220 and a main circuit board assembly 230 which may be snapped to each other to produce an assembled unit. In this arrangement, the main circuit board assembly as well as carrying the charger circuitry comprises the base plate of the device 200. The battery 212 may be charged by applying electrical current to its battery contacts 214. The battery 212 when positioned within the housing assembly 220 may be charged through the current provided by the charger circuitry of the main circuit board assembly 230.

The housing assembly 220 comprises a molded housing piece 222 made of polycarbonate material. A pocket 226 is formed on the molded housing piece 222 for receiving the battery 212. Holes 228 are positioned in the pocket 226 and provide passages through which battery contacts 214 electrically couple to the charger circuitry of the main circuit board assembly 230. The housing assembly 220 also includes a switch assembly 223 for actuating a rapid charge feature and a light guide 224 for receiving (LED) indicators.

The main circuit board assembly 230 which comprises the electrical assembly of the present invention includes an integrally molded member 232 made of polyamide material. The member 232 is provided utilizing well known molding processes, such as injection molding. It is well known that the molded member may be formed to integrally include flat portions as well as three dimensional protrusions and projections. The molded member 232 includes flat portions 260 for positioning thereon a number of electrical components 234, such as ICs, capacitors, and resistors. In the preferred embodiment of the invention the electrical components 234 are positioned on top side 237 of the molded member 232. However, it may be appreciated that the electrical components 234 may be placed on top, bottom, or both sides of the molded member 230. The components 234 are electrically interconnected and constitute the charger circuitry for the device 200.

The molded member 232 includes protrusions and/or projections which among other things form two embodiments of three dimensional connectors 236 and 238. The connectors 236 and 238 are shaped according to the design requirements of the device 200. In one embodiment, the three dimensional connector 236 comprises a single receptacle connector having multiple contacts 242. In another embodiment, the three dimensional connectors 238 comprise two spring finger connectors 266 in both embodiments, the connectors 236 and 238 comprise electrical connectors and are integral parts of the molded member 232. The electrical connection between the connectors 236 and 238 and other devices is made through contacts 242 and 244. The process of forming the contacts 242 and 244 on the connectors 238 and 238 is described later in this specification. The receptacle connector 236 is utilized for receiving a jack 240 which provides the AC supply for the device 200. The spring finger connectors 238 provide the electrical connections between the charger circuitry and the battery contacts 214. When the battery 212 is inserted into the pocket 226, the spring finger connectors 238 couple to the battery contacts 214 through the holes 228 of the molded housing piece 222. The spring finger connectors 238 are formed to provide a resilient contact between the spring finger connectors 238 and battery contacts 214. The resilient contact between the spring finger connectors 238 and battery contacts 214 insures optimum electrical connection when the battery 212 is inserted into the device 200. It may be appreciated that based on the design requirements of the device 200, the molded member 232 may be formed to integrally include three dimensional connectors of different shapes and varieties. Similarly, other protrusions and/or projections 250 may be formed to among other things provide alignment and fastening means between the housing assembly 220 and the main circuit board assembly 230. The housing assembly 220 and the main circuit board assembly 2390 are aligned and fastened to each other by a snapping mechanism provided by complimentary projections and apertures formed on the housing assembly 220 and the main circuit board assembly 230.

Electrical interconnections between the components 234 as well as the electrical contacts 242 and 244 are provided by disposing conductive electrical paths 235 on the molded member 232. The conductive electrical paths 235 may comprise conductive electrical printed circuitry. The conductive electrical paths 235 are patterned such that they interconnect the components 234 and the contacts 242 and 244 in accordance with the design requirements of the charger circuitry. The process of disposing conductive electrical paths 235 on the molded member 232 is well known in the art and may include thick or thin film metallization processes. After the conductive electrical paths 235 are disposed on the molded member 232, the components 234 may be placed utilizing well known automated technology, such as leadless component assembly. During the process of disposing the conductive electrical paths 235 on the molded member 232, the contacts 242 and 244 are formed on the electrical connectors 236 and 238. Accordingly, the contacts 242 and 244 are an integral part of the conductive electrical paths 235.

Referring to FIG. 3, a portion of the main board assembly 230 which includes the receptacle connector 236 is shown. The receptacle connector 236 is three dimensionally shaped to receive the jack 240 which provides the supply voltage to the charger circuitry. The jack 240 comprises a flat molded member 246 having connected thereto spring contacts 248. The flat member 246 is slidable into grooves 252 which are formed on the connector 236. When the flat member 246 is sufficiently inserted into the grooves 252, a protrusion 254 which is formed on the flat member 246 is snapped into a hole 256 positioned within the groove. When the protrusion 254 is snapped in to the hole 256, the connector 236 and the jack 240 are securely engaged to each other. At the same time, the spring contacts 248 are coupled to the contacts 242 providing an electrical connection therebetween. As mentioned above, the contacts 242 are integrally a part of the conductive electrical paths 235. Accordingly, the supply voltage of the jack 240 is coupled to the various components 234, thereby making the charge circuitry operational.

Referring to FIG. 4, a portion of the electrical assembly 230 which includes the spring finger connectors 238 is shown. In the preferred embodiment of the invention, the spring finger connectors 238 carry charger current to the battery contacts 214 (shown in FIG. 2). The finger spring connectors 238 are integrally projected outwardly within openings 262 and form cantilevered arms 264. The cantilevered arms 264 carry upright posts 266 which make the final connections to the battery contacts 214. In this arrangement, the spring finger connectors 238 may freely move in limited upwardly and/or downwardly directions, thereby providing resilient connection mechanism. The conductive electrical paths 235 are patterned to cover the cantilevered arms 264 and the upright posts 266, and therefore, providing the charge current from the charger circuitry to the battery contacts 214.

Figure 1:
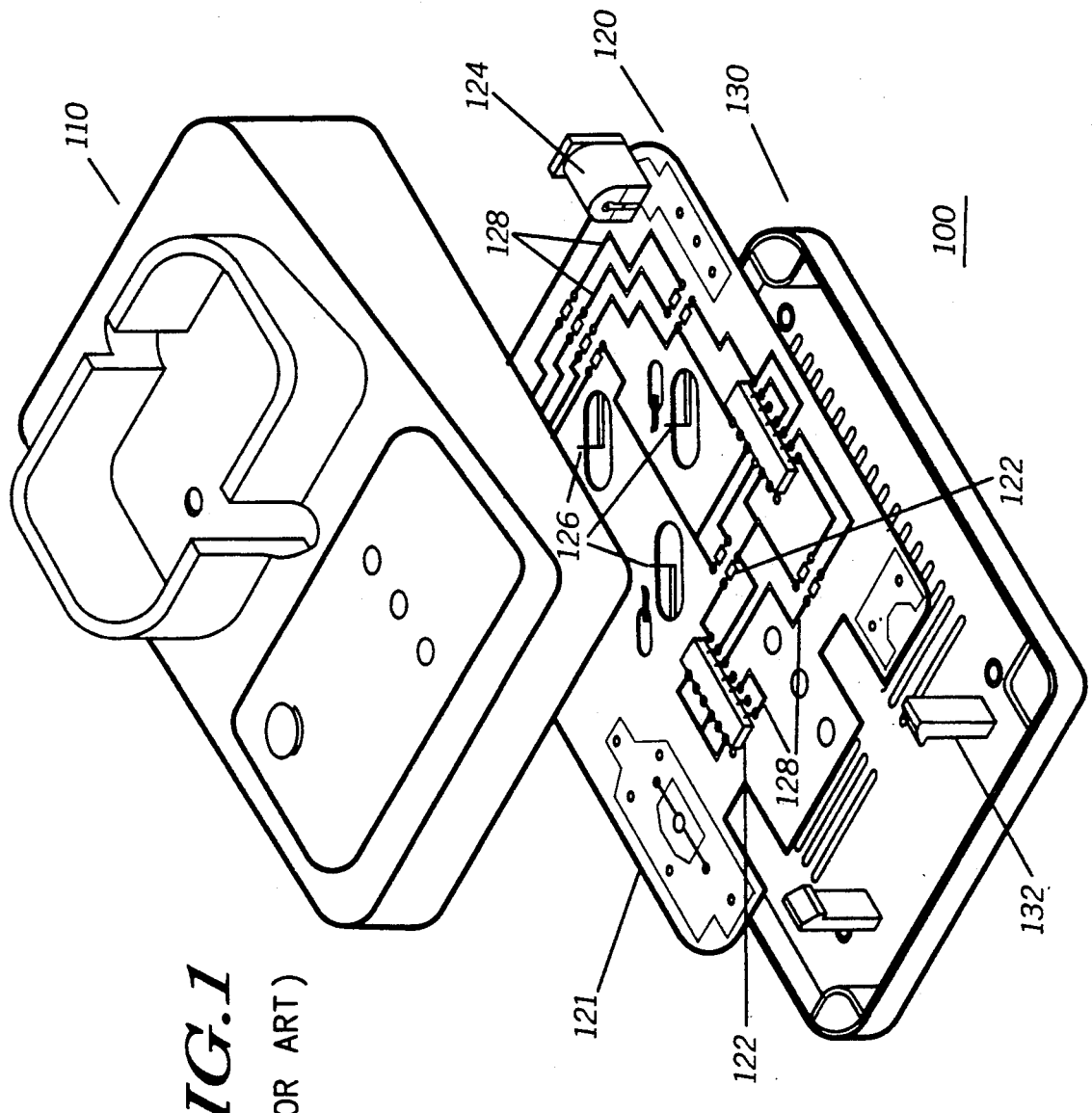
FIG. 1, is an exploded view of the electrical assembly according to the prior art.

Accordingly, the electrical connectors 236 and 238 are an integral part of the main board assembly 230 and may be coupled to other connectors or devices in order to provide electrical connection therebetween. It may be appreciated that the number of components on the main board assembly 230 is reduced by integrally including the connectors 236 and 238 on the molded member 230 and disposing conductive electrical paths 235 thereon. In the arrangement of the present invention, the electrical assembly 230 in addition to carrying the charger circuitry and integrally including the connectors 234 and 238 also comprises the base plate for the device 200. It will be apparent from the above description that by utilizing the principals described in conjunction with the main board assembly 230, the quality and manufacturing cost of the electronic unit 200 may be tremendously improved over the prior art electronic device 100 (shown in FIG. 1).

What is claimed is:

1. An electrical assembly comprising:
    a molded member having at least one three-dimensional connector; said three-dimensional connector comprising at least one three dimensional resilient support molded integral with and extending from said molded member, said at least one three dimensional resilient support being of the same material as said molded member; and conductive electrical paths disposed on said molded member, wherein portions of said conductive electrical paths cover at least part of said at least one three dimensional resilient support.

2. The assembly of claim 1 wherein said at least one three-dimensional resilient support comprises a cantilevered arm and an upright post carried by said cantilevered arm.

3. The assembly of claim 1, wherein said molded member includes electrical components electrically interconnected by said conductive electrical paths.

4. An electrical assembly comprising:
a molded member having a flat portion and a three-dimensional connector portion; said three-dimensional connector portion comprising at least one three dimensional support molded integral with and extending from said molded member said at least one three dimensional support being of the same material as said molded member; and
conductive electrical path disposed on said molded member, wherein portions of said conductive electrical path cover at least part of said at least one three dimensional resilient support.

5. The assembly of claim 4, wherein said at lest one three-dimensional resilient support comprises a cantilevered arm and an upright post carried by said cantilevered arm.

6. The assembly of claim 4, wherein said molded member includes electrical components positioned on said flat portion, and wherein said electrical components are electrically interconnected by said conductive electrical paths.

* * * * *